Figure 1:
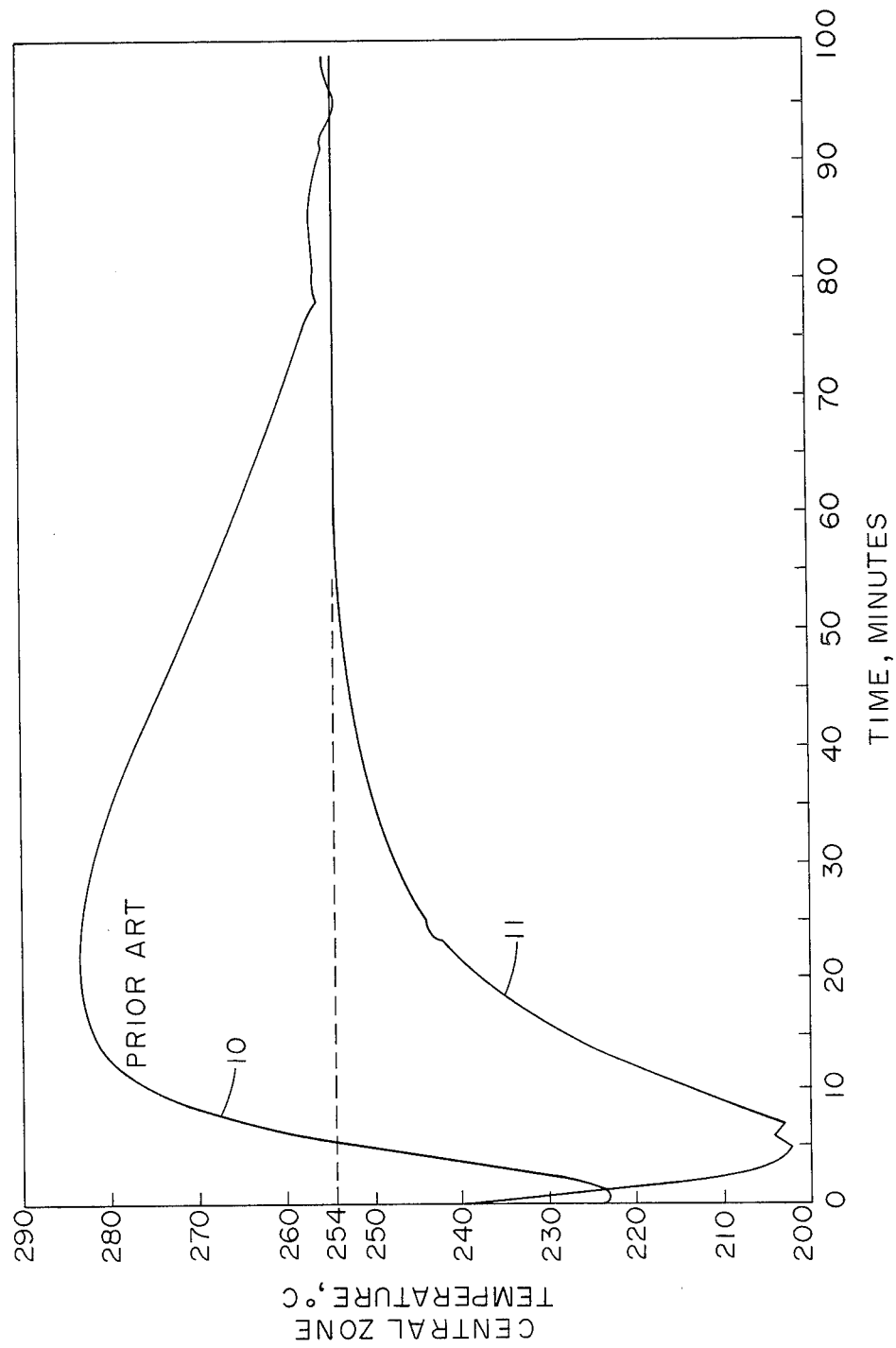

United States Patent [19]

Yu

[11] Patent Number: 4,711,989
[45] Date of Patent: Dec. 8, 1987

[54] DIFFUSION FURNACE MULTIZONE TEMPERATURE CONTROL

[75] Inventor: Chorng-Tao Yu, Placentia, Calif.

[73] Assignee: Thermco Systems, Inc., Orange, Calif.

[21] Appl. No.: 864,676

[22] Filed: May 19, 1986

[51] Int. Cl.$^4$ .............................................. H05B 3/64
[52] U.S. Cl. .................................. 219/390; 219/388; 219/494; 219/411; 118/725; 118/50.1
[58] Field of Search ............... 219/388, 390, 494, 497, 219/501, 411, 405, 354; 118/50.1, 724, 725, 728

[56] References Cited

U.S. PATENT DOCUMENTS

| | | | |
|---|---|---|---|
| 2,391,195 | 12/1945 | Ross | 34/48 |
| 2,422,734 | 6/1947 | Jung | 219/497 |
| 2,843,714 | 7/1958 | Stanton | 219/494 |
| 3,385,921 | 5/1968 | Hampton | 219/497 |
| 4,243,441 | 1/1981 | Wilson | 219/388 |
| 4,348,580 | 9/1982 | Drexel | 219/390 |

FOREIGN PATENT DOCUMENTS 52-74138  6/1977  Japan .................................. 219/497

Primary Examiner—E. A. Goldberg
Assistant Examiner—Teresa J. Walberg
Attorney, Agent, or Firm—John K. Williamson

[57] ABSTRACT

There is a substantial heat loss and drop in temperature in a hot-wall diffusion tube when a batch of wafers at room temperature is loaded into the tube. The temperature of the atmosphere in a zone in the tube is quickly recovered by sensing both the temperature of the tube atmosphere and the temperature of a heating element surrounding the zone with thermocouples, mixing the signals of the thermocouples to produce a ratio average signal and then controlling the heat input to the heating elements in response to the ratio average of the sensed temperature.

6 Claims, 6 Drawing Figures

DIFFUSION FURNACE MULTIZONE TEMPERATURE CONTROL

This invention relates to the control of temperatures in diffusion furnaces used in the semiconductor industry to process wafers.

Diffusion furnaces are used in the semiconductor industry for batch processing wafers. In a typical cycle, a batch of relatively cold wafers is loaded into a horizontally disposed diffusion tube of a "hot wall" furnace through an opened door in one end thereof (which results in a substantial heat loss from the diffusion tube), the wafers and their carriers are heated by the gases flowing through the diffusion tube, the diffusion tube and wafers are brought up to a predetermined temperature, the wafers are annealed or doped or receive some other diffusion or deposition treatment, and the treated wafers are then withdrawn from the diffusion tube for further processing. The wafers are usually located only in the "flat zone" of a diffusion tube because process specifications usually specify that atmospheric temperatures in the processing areas should be within ±1° C. or less of the nominal temperature and the ends of the tubes cannot be sufficiently controlled to this specification. Therefore, diffusion tubes usually are divided into multiple zones with the temperature of each zone being controlled in response to the temperature in the zone as sensed by, e.g., a thermocouple. Thus, there are usually at least three zones including a central zone disposed between two end zones.

U.S. Pat. No. 4,276,603 to Beck et al. entitled "Diffusion Furnace Microcontroller" ("Beck") illustrates a microprocessor-based multiple-zone temperature control system in which a dedicated controller provides electric power to resistance heating elements disposed around the periphery of the associated diffusion tubes in response to the sensed temperature in the respective zones of the diffusion tubes. As the Beck patent discloses (see, e.g., FIG. 4 and Column 7, line 30, to Column 11, line 46), the power may be controlled in one or more of three well known modes, including proportional band, integral and derivative control (which frequently is referred to as "PID" control by the industry). The Beck pa tent further discloses at Column 10, line 50, to Column 11, line 4, the controller system may be designed to either respond to the temperature of the heating element or of the diffusion tube atmosphere.

Precise control in response to the temperature of the diffusion tube atmosphere tends to be very difficult during the temperature recovery period when the fully loaded tube must be heated up to the process temperature as quickly as possible Curve 10 of FIG. 1 shows the temperature response of the center zone of a 225/235 mm inside/outside diameter diffusion tube in a microprocessor-controlled furnace which was originally at about 250° C. and then loaded with 100 150 mm wafers. 15 standard liters per minute ("SLPM") of nitrogen were continuously purged through the tube throughout the temperature recovery period. Curve 10 shows that the temperature of the atmosphere in the zone substantially overshot the set point and the temperature was not yet stabilized to ±1° C. until after over an hour and a half after the wafers were loaded. Because good manufacturing practice requires that a process not be initiated until after a system is under control, the process cannot be initiated until it stabilizes to within ±1° C. In contrast, Curve 11 shows the temperature response of the same tube under control of the present invention.

Similarly, precise control in response to the temperature of the heating elements also is difficult to control during the temperature recovery period. Curve 12 of FIG. 2 and Curve 14 of FIG. 3 show the tube atmospheric temperature in the central zone of a diffusion tube controlled by a microprocessor-based system as a function of the temperature of a resistance heating element. Curve 12 illustrates a desired furnace temperature of 450° C. and Curve 14 illustrates a desired furnace temperature of 600° C. In both cases, a 225/235 mm diameter diffusion tube was loaded with 50 150 mm diameter wafers and heated up to the desired furnace temperatures while 10 SLPM of nitrogen were continuously purged through the tube. The data underlying Curves 12 and 14 may be summarized as follows:

| Curve | Furnace Temperature | Recovery Time (±5° C.) | Recovery Time (±1° C.) |
|---|---|---|---|
| 12 | 450° C. | 49 min. | 82 min. |
| 14 | 600° C. | 32 min. | 62 min. |

This method of control is clearly stable but the recovery times are unacceptable. As the above table shows, the recovery period of lower temperature processes is longer than the recovery period of higher temperature process. The problem here is that the thermocouples located near the resistance heating elements quickly reach their set points and cut off the power even though the wafer temperature is not up to the processing temperature. Because the heating elements contain more heat at higher temperatures in the higher temperature process, the higher temperature process recovers faster.

It has been found that a vastly superior method of controlling processing temperature is to control the temperature in response to a ratio average of the diffusion tube atmosphere itself and the temperature of a heating element. Although it would be expected that such a method would result in extended temperature recovery times, the improved method in fact results in recovery times which are much less than the recovery times obtained where the zone temperature is controlled in response to the heating element or zone temperature. This is primarily due to the fact that the averaged temperature calls for more power early in the recovery period than do either of the prior art systems. In addition, the diffusion tube (and wafer) temperature overshoot above the set point is held to an acceptable minimum, and temperature ramp-up is stable (which implies a stable power demand). In the improved temperature control method, the diffusion tube is divided into one or more central zones, the temperature of the atmosphere in the tube in at least one zone and the temperature of a heating element of that zone are each sensed by thermocouples, the sensed temperatures are averaged together, and the heat input to the zone is then controlled in response to the ratio average of the temperatures of the furnace and the heating element in the zone. The temperatures may be averaged (or, more accurately, the signals from the thermocouples, are mixed) by an analog circuit or by a software program.

Figure 5:
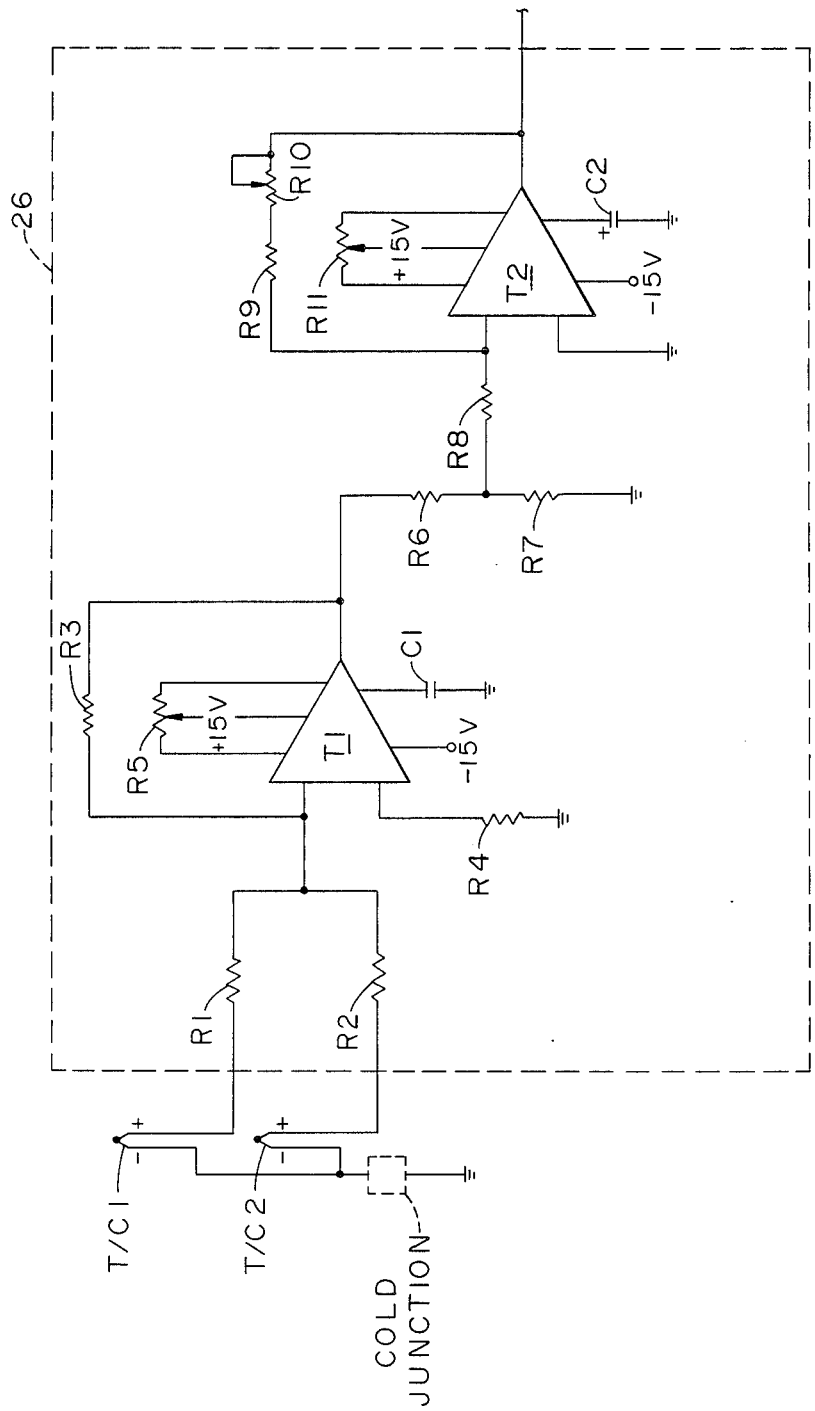

FIG. 5 shows a circuit which may be used for averaging the temperatures sensed by two thermocouples T/C 1 and T/C 2 in a zone of a diffusion tube. One thermocouple, e.g., T/C 1, senses the temperature of the tube atmosphere and the other thermocouple, e.g., T/C 2, senses the temperature of a heating element. Basically, the circuit performs the function $$\frac{aX + bY}{a + b}$$

The temperature readings X and Y of the thermocouples are fed through averaging (and here equivalent) resistors R1 and R2, respectively, to an analog inverting adder or amplifier T1. The output from the amplifier T1 goes through a voltage divider comprising resistors R6 and R7. The output from the voltage divider is then inserted, buffered and adjusted to unity gain by the amplifier T2, which has a precision trimming potentiometer R10. The output from the amplifier T2 is then fed to a PI or PID temperature control loop. (See, e.g., the previously mentioned U.S. Pat. No. 4,276,603 to Beck which illustrates one system). The ratio output of the thermocouple may be adjusted by varying certain resistors in the circuit. The following shows three such adjustments (in 1000 ohms):

| TC1/TC2 | 33%/67% | 50%/50% | 67%/33% |
|---------|---------|---------|---------|
| R1      | 10      | 10      | 4.99    |
| R2      | 4.99    | 10      | 10      |
| R4      | 2.49    | 3.32    | 2.49    |

The other resistors in this circuit were rated as follows in all cases: R3 and R9 and R8 all were rated at 10K ohms; R5 and R11 at 100K ohms; R10 at 1K ohm; and R7 and 10 ohms in all cases and R6 was 10 ohms in the 50%/50% case and 20 ohms in the 33%/67% and the 67%/33% cases. Both C1 and C2 were rated at 0.1 microfarad. A 50%/50% ratio mix was utilized in the tests disclosed in this specification.

Figure 6:
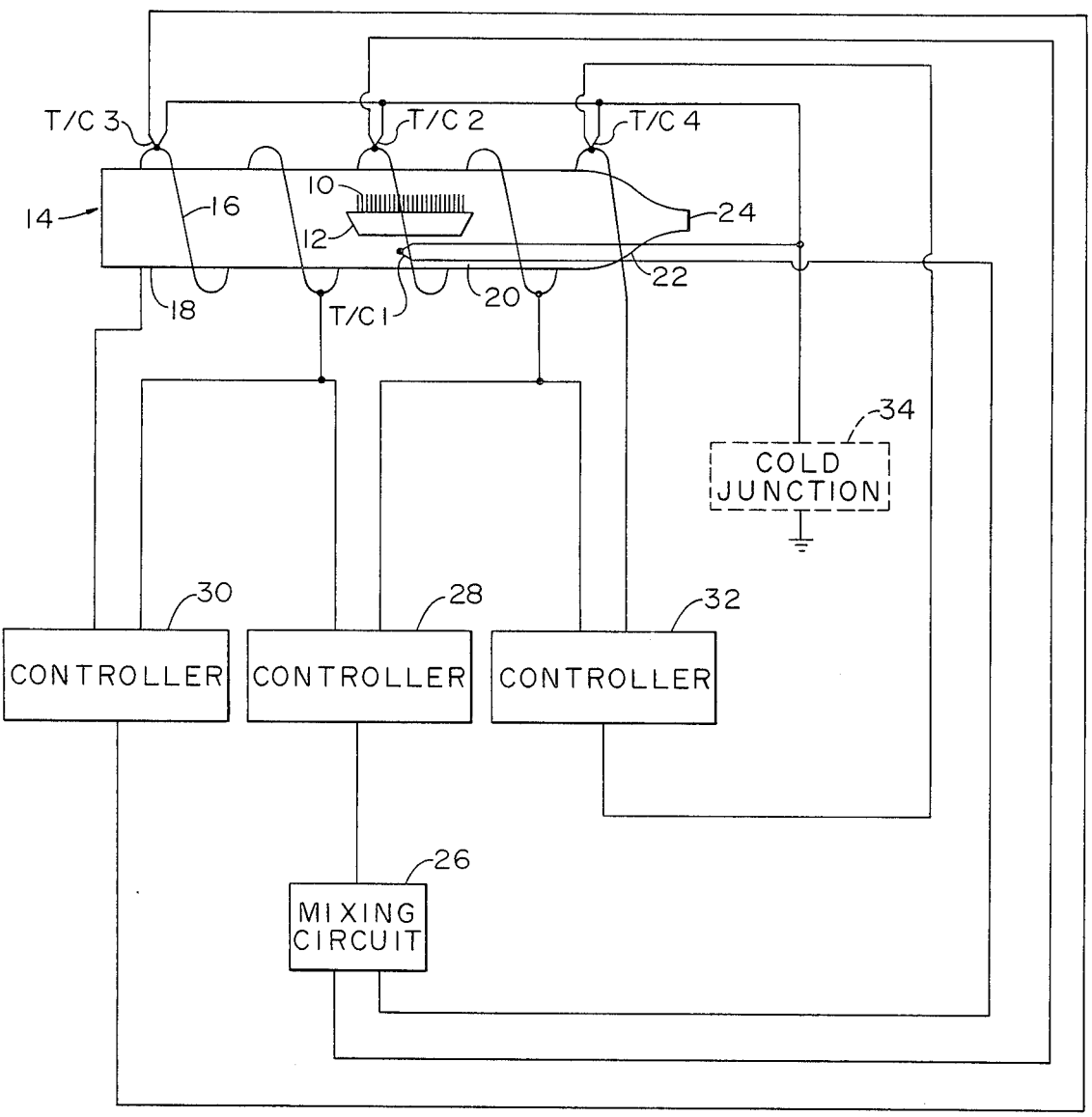

FIG. 6 schematically shows conventional apparatus with the mixing circuit of FIG. 5, which is designated by the numeral 26. Wafers 10 in a boat 12 are disposed in the central zone 20 of a process tube 14 having an electrical resistance wire 16 around its periphery. The boat 12 is loaded into and withdrawn from the tube 14 through a door (not shown) in load end 18. Source gas is introduced into the tube 14 through a nozzle connection 24 in source end 22. The temperature of the atmosphere in the central zone 20 is sensed by thermocouple T/C 1 and the temperature of the resistance heating element 16 in the central zone 20 is sensed by thermocouple T/C 2. The signal from the thermocouples T/C 1 and T/C 2 in the central zone are mixed together and then the averaged signal is input to controller 28 for controlling electrical power to the central zone 20. The temperature of the resistance heating element 16 in the load end 18 is sensed by thermocouple T/C 3. The signal from thermocouple T/C 3 is input into controller 30 for controlling electrical power to the load end 18. Similarly the temperature of the resistance heating element 16 in the source end 32 is sensed by the thermocouple T/C 4. The signal from the thermocouple T/C 4 is input into controller 32 for controlling electrical power to the load end. All thermocouples share the same cold junction compensation device 34 as shown.

A 190/196 mm diameter diffusion tube was heated up to 450° C. and 600° C. in a series of tests utilizing the improved averaged temperature control method to heat a central zone. The temperature of two end zones; i.e., those portions of the tube at the load and source ends were controlled in response to the zone heating element temperature only. Equal weight was given to the temperatures of the tube atmosphere and resistance heating elements in the zone. An automatic microprocessor-based control system was utilized to monitor and control the tube temperature and other process variables. As was done in the earlier described tests performed at 450° C. and 600° C., 50 150 mm diameter wafers were loaded into the diffusion tube and 10 SLPM of nitrogen were continuously purged through the tube.

Figure 2:
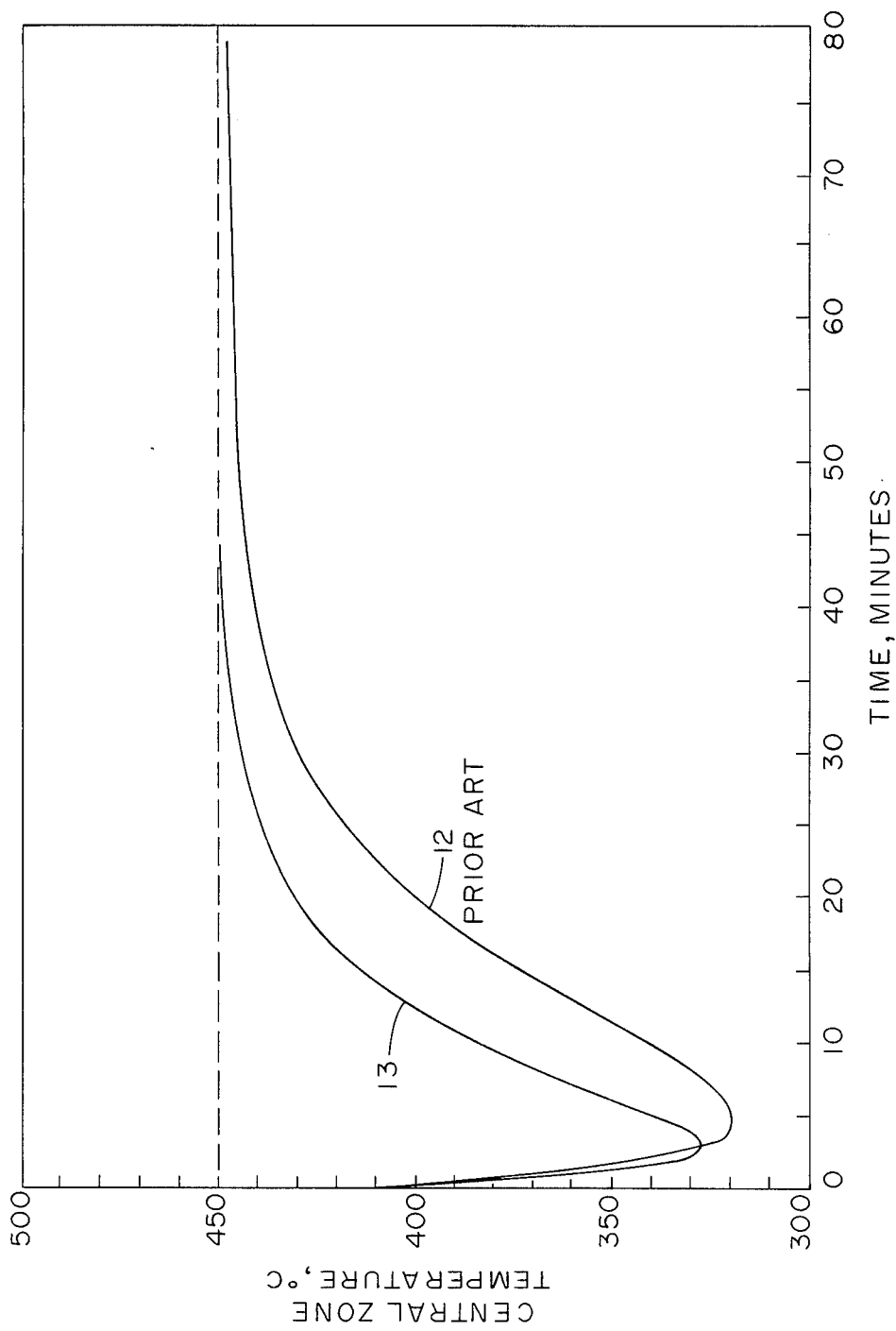
Figure 3:
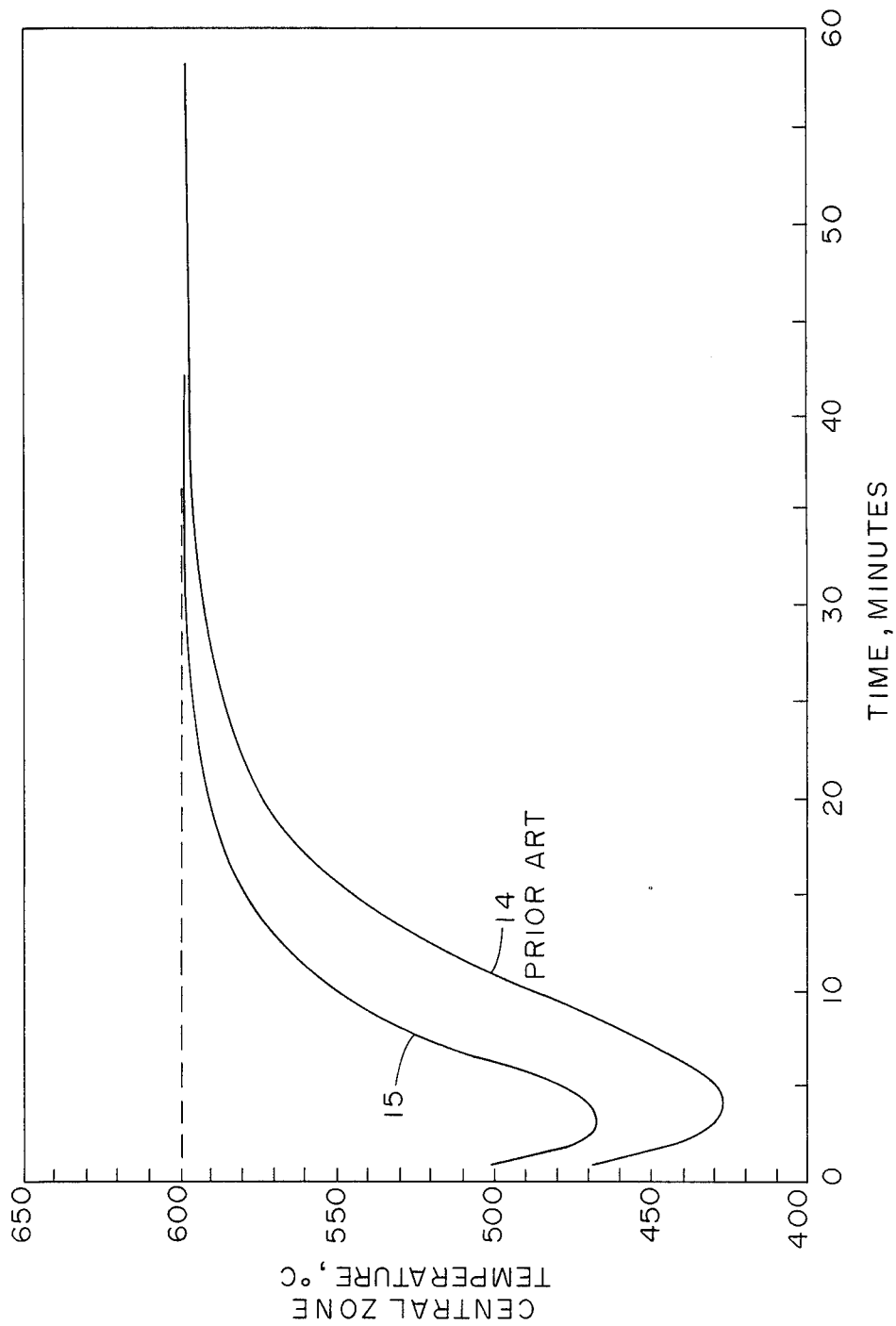

Curve 13 of FIG. 2 indicates the diffusion tube temperature as it recovers to 450° C. under thermocouple ratio control of the present invention. Curve 15 of FIG. 3 indicates the tube temperature as it recovers to 600° C. under thermocouple ratio control of the present invention. The data of Curves 13 and 15 (which exemplifies the invention) may be compared with the data of Curves 12 and 14 (which exemplifies the prior art) as follows:

| Curve | Tube Temperature | Recovery Time (± 5° C.) | Recovery Time (± 1° C.) |
|-------|------------------|-------------------------|-------------------------|
| 12    | 450° C.          | 49 min.                 | 82 min.                 |
| 13    | 450° C.          | 29 min.                 | 41 min.                 |
| 14    | 600° C.          | 32 min.                 | 62 min.                 |
| 15    | 600° C.          | 23 min.                 | 33 min.                 |

These numbers are for the entire wafer load temperature (as sensed at three points under the wafers) to reach ±5° C. or ±1° C. of set point. This data table shows that the temperature recovery times of a diffusion furnace controlled by averaged sensed temperatures are substantially reduced.

Figure 4:
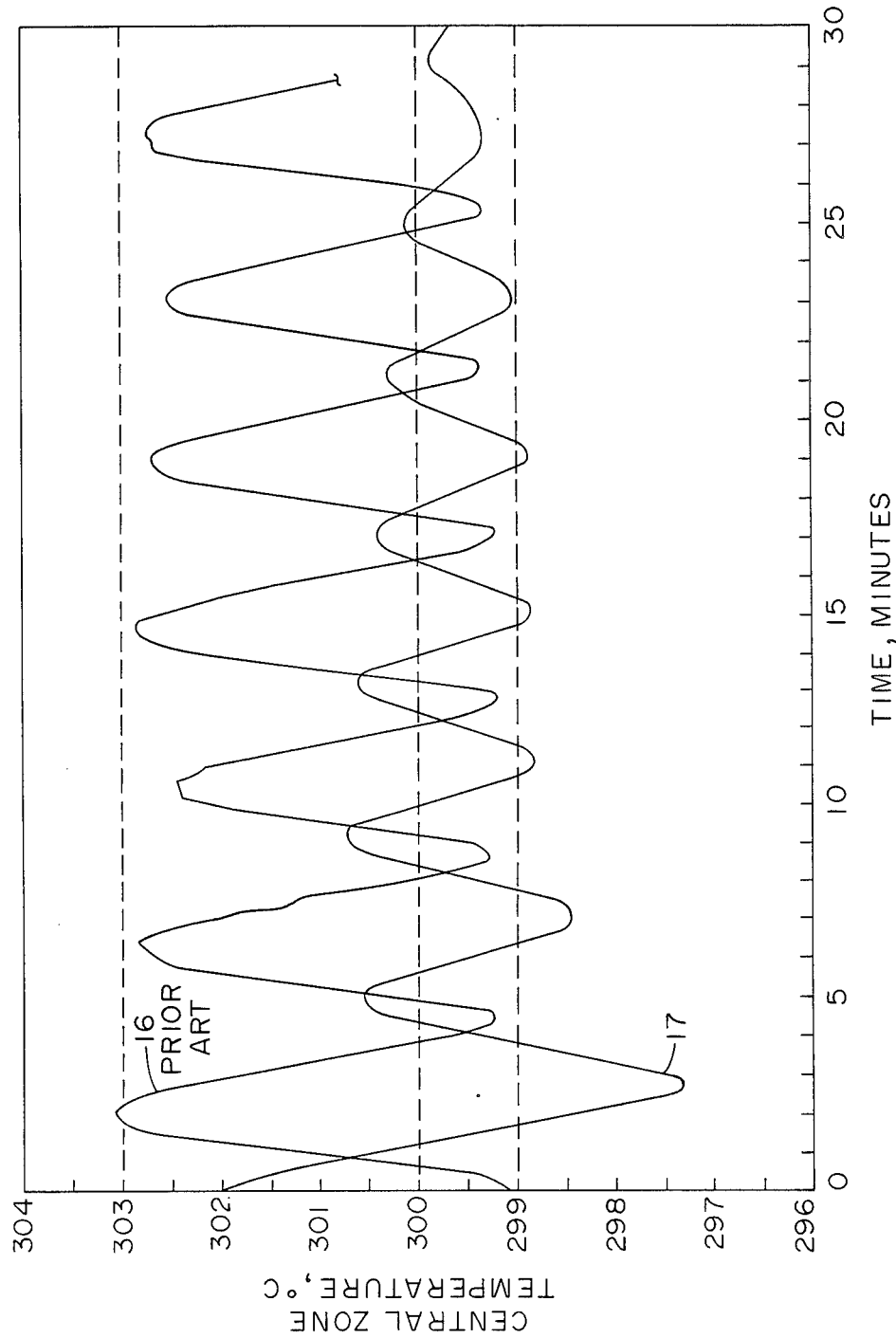

The stability of the new temperature control system was compared with the prior art system wherein the temperature of the heating element in a zone is controlled. (A comparison of Curve 12 on FIG. 2 and Curve 14 on FIG. 3, both of which illustrate heating element control, with Curve 10 on FIG. 1, which illustrates tube atmosphere control, shows that heating element control is the more stable of the two prior art systems). The test was conducted with a diffusion tube containing 150 150 mm wafers and purged with 15 SLPM nitrogen. A narrow proportional band was utilized to generate oscillation. FIG. 4 shows the temperature of the heating elements. Curve 16 illustrates the prior art control system and shows that there was a 4° C. peak-to-peak cycle of the heating element temperature (with a stable temperature in the tube to within 0.10° C. standard deviation). Curve 17 illustrates the present invention and shows there was only about 1° C. peak-to-peak cycle of the heating element temperature at 30 minutes (with a stable temperature in the tube to within 0.06° C. standard deviation). This indicates that the new system will tolerate a relatively higher gain than will the prior art system, which in turn allows an increased heat up rate.

The invention is not to be limited by what has been particularly shown and described except as indicated in the appended claims.

What is claimed is:

1. A method for recovering the atmospheric temperature in a multi-zone diffusion tube containing a freshly loaded batch of wafers, said tube having resistance heating elements disposed around its periphery, comprising the steps of:

(a) providing at least one central zone between a load end zone and a source end zone;

(b) loading a batch of wafers into the central zone;
(c) heating the tube atmosphere toward a predetermined temperature;
(d) sensing the temperature of a heating element in the central zone;
(e) sensing the temperature of the tube atmosphere in the central zone;
(f) controlling the heat input to the heating elements disposed around the central zone in response to a ratio average of the sensed temperatures of the heating element in the central zone and the tube atmosphere in the central zone.

2. The method of claim 1 comprising the additional steps of sensing the temperature of a heating element in each of the two end zones of the tube; and controlling the temperature in each end zone in response to the sensed temperature of the heating element in the end zone while the temperature of the central zone is controlled in response to a ratio average of the atmosphere temperature in the zone and the temperature of a heating element in the zone.

3. The method of claim 1 wherein the tube atmosphere is heated to about 600°.

4. The method of claim 1 wherein the tube atmosphere is heated to about 450° C.

5. The method of claim 1 wherein the tube atmosphere is heated to about 250° C.

6. A method of controlling the temperature of the atmosphere in a semiconductor wafer diffusion tube having resistance heating elements disposed about its periphery, comprising the steps of:
(a) providing at least one central zone between a load end zone and a source end zone;
(b) loading a batch of wafers into the central zone;
(c) heating the tube atmosphere toward a predetermined temperature;
(d) sensing the temperature of a heating element in the central zone;
(e) sensing the temperature of the tube atmosphere in the central zone;
(f) controlling the heat input to the heating elements disposed around the central zone in response to a ratio average of the sensed temperatures of the heating element in the central zone and the tube atmosphere in the central zone; and
(g) maintaining the temperature of the tube atmosphere in the central zone to within $\pm 1°$ C. of the set point while processing the wafers.

* * * * *